(12) United States Patent
Do et al.

(10) Patent No.: US 6,190,752 B1
(45) Date of Patent: Feb. 20, 2001

(54) THIN FILMS HAVING ROCK-SALT-LIKE STRUCTURE DEPOSITED ON AMORPHOUS SURFACES

(75) Inventors: Khiem B. Do, Sunnyvale; Pin-Chin Connie Wang, Menlo Park; Robert H. Hammond, Los Altos; Theodore H. Geballe, Woodside, all of CA (US)

(73) Assignee: Board of Trustees of the Leland Stanford Junior University, Palo Alto, CA (US)

( * ) Notice: Under 35 U.S.C. 154(b), the term of this patent shall be extended for 0 days.

(21) Appl. No.: 09/191,449

(22) Filed: Nov. 12, 1998

Related U.S. Application Data

(60) Provisional application No. 60/065,324, filed on Nov. 13, 1997.

(51) Int. Cl.⁷ .................................. B32B 3/10; B32B 9/00
(52) U.S. Cl. ................... 428/141; 428/469; 428/471; 428/472; 428/692; 428/698; 428/701; 428/702
(58) Field of Search .................................. 428/384, 389, 428/469, 471, 472, 692, 698, 700, 701, 141

(56) References Cited

U.S. PATENT DOCUMENTS

| 5,403,673 | * | 4/1995 | Haga et al. | 428/688 |
| 5,453,306 | * | 9/1995 | Tatsumi et al. | 4278/569 |

FOREIGN PATENT DOCUMENTS

| 0410627A1 | 1/1991 | (EP) . |
| 0669411A2 | 8/1995 | (EP) . |
| 01099268 | 4/1989 | (JP) . |

OTHER PUBLICATIONS

"Control of bi-axial texture of MgO thin films by ion beam assisted deposition (IBAD)", Khiem B. Do et al., Standford University. pp. 1–12 (1995) (No month), Dec. 1995.*

Sonnenberg, et al., "Preparation of biaxially aligned cubic zirconia films on pyrex glass substrates using ion–beam assisted deposition", *J. Appl. Phys.* 74 (2) (Jul. 15, 1993), pp. 1027–1034.

Bradley, et al., "Theory of thin–film orientation by ion bombardment during deposition", *J.Appl.Phys.* 60(12) (Dec. 15, 1996), pp. 4160–4164.

Iijima, et al., "Biaxially Aligned $YBa_2Cu_3O_7-x$ Thin Film Tapes", *Physica C* 185–189 (1991), Elsevier Science Published B.V., pp. 1959–1960. (No month).

McIntyre, et al., "Transmission electron microscopy investigation of biaxial alignment development in YSZ films fabricated using ion beam assisted deposition", *J. Vac. Sci. Technol. A* A 14(1), (Jan./Feb. 1996) pp 210–215.

Ressler, et al., "The Development of Biaxial Alignment in Yttria–Stabilized Zirconia Films Fabricated by Ion Beam Assisted Deposition", Ceramics Processing Research Laboratory, MIT, Cambridge, MA (Apr. 6, 1995), pp 35–42.

He, Qing, et al., "Deposition of biaxially–oriented metal and oxide buffer–layer films on textured Ni tapes: new substrates for high–current, high–temperature superconductors", *Physica C* 275 (1997) 155–161. (No month).

(List continued on next page.)

Primary Examiner—Timothy M. Speer
Assistant Examiner—Bryant Young
(74) Attorney, Agent, or Firm—Fish & Richardson P.C.

(57) ABSTRACT

A thin film of material having a rock-salt-like structure is deposited on a smooth amorphous substrate surface by ion beam assisted deposition.

61 Claims, 6 Drawing Sheets

OTHER PUBLICATIONS

Mao, Yingjun, et al., "Ion beam assisted deposition of biaxially textured YSZ thin films as buffer layers for YBCO superconduction films", *Physica C* 282–287 (1997) 611–612. (No month).

Yang, F., et al., "Control of the In–Plane Alignment and the Critical Current of Polycrystalline $YBa_2Cu_3O_{7-x}$ Thin Films", *Applied Superconductivity*, vol. 3, No. 1–3, pp. 105–111 (1995) (No month).

* cited by examiner

THIN FILMS HAVING ROCK-SALT-LIKE STRUCTURE DEPOSITED ON AMORPHOUS SURFACES

This application claims priority to Provisional Application Ser. No. 60/065,324 filed Nov. 13, 1997, entitled "Apparatus and Method for Ion Beam Induced Texturing on Thin Films on Amorphous Substrates".

BRIEF DESCRIPTION OF THE INVENTION

This invention relates generally to thin films. More particularly, this invention relates to thin oxide films of the type having a rock-salt-like structure, deposited on amorphous surfaces with substantially in-plane alignment as well as substantially out-of-plane alignment.

BACKGROUND OF THE INVENTION

There are an increasing number of thin film and thick film materials which, in their application to devices of all types, depend on properties dependent on their anisotropic physical properties, or which require low-angle grain boundaries between grains. Thus, these materials must be deposited in special orientations in order to utilize their properties. The present method of achieving this is to epitaxially deposit onto carefully selected single crystal substrates with matching lattice constants and chemical compatibility.

Ion beam assisted deposition (IBAD) has shown promise as means to produce textured films on non-epitaxial substrates that can then subsequently be used as a structural template for the deposition of other films, eliminating the requirement of single crystalline substrates. The material commonly used has been (100)-oriented Yttria-Stabilized-Zirconia (YSZ). However, the texturing of (100) YSZ evolves slowly, so a thick film (>0.5 $\mu$m) is required to achieve good in-plane alignment (~13°), limiting the application of YSZ due to high processing time and cost. Other materials, characterized by rock salt and rock salt-like structures, have been considered potentially advantageous for use as templates for forming well textured layers such as superconducting films due to their simple crystal lattice which tends to naturally align with a preferred surface for subsequent growth of textured films {(001) type sheet axis}. Rock salt structures tend to have a reasonable lattice match with films such as YBCO and PZT which make them attractive for a variety of electronic and electrical applications. In addition, the simple chemistry of these structures makes them easier to process than the more complex multi-cation structures. By "rock-salt material" is meant a structure having a cF8 Pearson symbol and a B1 Sturukturbericht designation. Typical rock salt materials are described, for example, by "Metals Handbook, Ninth Edition", volume 9, p707–711, which pages are herein incorporated in their entirety by reference , and by C. S. Barrett and T. B. Massalski, "Structure of Metals", McGrawHill, 3rd edition, 1966, p.240–241, which pages are herein incorporated in their entirety by reference. Exemplary rock salt materials include CaO, SrO, TiN, ZrO, and BaO. By "rock-salt-like material" is meant a material with a crystalline structure with atomic arrangements identical to or similar to that in rock-salt, such as cubic structures with (100) close-packed planes or cubic structures in which a part of the lattice (some planes) has the same atomic arrangement as in rock-salt. Examples, in addition to rock salt materials, are rock-salt superstructure B1, cubic superlattice LI$_2$ spinel superlattice H1$_1$, and perovskites & perovskite superstructures E2$_1$. Exemplary compounds with rock-salt superstructure B1 are LiNiO$_2$, and LiInO$_2$. Typical cubic superlattice LI$_2$ compounds are Ni$_3$Al, Au$_3$Cu, AlZr$_3$, etc. Typical spinet superlattice H1$_1$ compounds are MgAl$_2$O$_4$, and $\gamma$-Al$_2$O$_3$. Typical perovskites & perovskite superstructures E2$_1$ compounds are SrTiO$_3$, CaTiO$_3$, NdGaO$_3$, LaAlO$_3$, SrZrO$_3$, BaZrO$_3$, and SrRuO$_3$. However, at present, these materials are typically used either in expensive single crystal forms or as epitaxially grown films which must be produced upon substrates which themselves exhibit a biaxially textured surface.

OBJECTS AND SUMMARY OF THE INVENTION

It is a general object of the present invention to provide an improved technique for producing textured films of materials having a rock-salt structure on amorphous substrates.

It is another object of the present invention to provide a technique for producing textured films having a rock salt-like structure on amorphous substrates.

It is a further object of the present invention to provide an economical method of producing textured films on an amorphous substrate.

It is a further object of the present invention to provide an economical thin film buffer layer for the deposition of high temperature superconductor material.

The present invention provides a method of forming textured thin films having a rock-salt-like structure on an amorphous surface employing ion beam assisted deposition of the thin film material and a method of forming composite articles including multiple film layers having substantial alignment both in-plane and out-of-plane.

In one aspect, the invention is a method of forming a composite article by forming a buffer layer including a first thin film formed on a smooth amorphous surface of a substrate from a material having a rock-salt-like structure and substantial alignment both in-plane and out-of-plane, and forming a second film having substantial alignment both in-plane and out-of-plane on a surface of said buffer layer, wherein said first film provides a template for the epitaxial growth of said second film. The first thin film is formed by ion-beam assisted deposition of the rock-salt-like material under first conditions of temperature, rock-salt-like material evaporation rate, ion energy and flux selected to promote formation of in-plane aligned crystallites of the rock-salt-like material on the smooth amorphous surface at the nucleation stage of film formation and subsequent pseudo-columnar growth of columns of the crystallites, resulting in substantial alignment both in-plane and out-of-plane.

Typically, the ion beam assistance is ended after the thickness of said first film is such that said smooth amorphous surface is substantially covered with said in-plane aligned crystallites and before the thickness of said first film is about twice the thickness at which said surface is substantially covered with said in-plane aligned crystallites. In one aspect, a homo-epitaxial layer of the rock salt-like material is then formed on the surface of the first film by deposition of the same rock salt-like material under second conditions of temperature and rock salt-like material evaporation rate which are elevated in relation to the first conditions to increase the thickness of the buffer layer. The first film provides a template for the epitaxial growth of the homoepitaxial layer. In other aspects, the method may include formation of additional buffer layer films of additional materials deposited after formation of the first film, and the first film will provide a template for the epitaxial growth of the these films.

In another aspect, the invention features an article, including a substrate with at least one smooth amorphous surface, a buffer layer comprising a first thin film formed on said smooth amorphous surface of said substrate from a material having a rock-salt-like structure, and a second film formed on a surface of said buffer layer. The first film has substantial alignment both in-plane and out-of-plane; and provides a template for the epitaxial growth of the second film. The second film may be formed from a material selected from the group consisting of superconductors, semiconductors, photovoltaic materials, magnetic materials, and precursors of superconductors. Typically, the RMS of the smooth amorphous surface is less than about 100 angstroms.

In some aspects, the entire substrate is amorphous, as for example, Metglas or $\alpha$-$Si_3N_4$. In other aspects, the substrate is a polycrystalline non-amorphous base structure with a smooth amorphous surface layer. In some aspects, this layer may be chemically identical to the base structure. For example, polycrystalline Ni in some forms is an intrinsically an ordered structure with an amorphous surface. The desired amorphous surface may also be created, for example, by laser glazing, ion damage, or high rate mechanical deformation. In other aspects, the layer is not chemically identical to the base structure and may be created, for example, by deposition or ion implantation. Suitable base structures include nickel alloys, and preferably alloys comprising nickel as a primary component, including Hastelloy and Metglas. In some aspects, the rock-salt-like material is a rock-salt material.

In a preferred embodiment, the rock-salt material is MgO and the thickness of the first film is less than about 200 Angstroms, preferably less than about 150 Angstroms, but greater than about 20 Angstroms. Its alignment is better than about 13 degrees. The buffer layer may include additional films, deposited homoepitaxially or heteroepitaxially, and the first film will provide a template for the epitaxial growth of all subsequently deposited films.

The second film may be formed from a material selected from the group consisting of superconductors, semiconductors, photovoltaic materials, magnetic materials, and precursors of superconductors.

BRIEF DESCRIPTION OF THE DRAWINGS

For a better understanding of the nature of the invention, attention is directed toward the following detailed description taken in conjunction with the accompanying drawings, in which.

DETAILED DESCRIPTION OF THE PREFERRED EMBODIMENT OF THE INVENTION

The invention will be described in connection with the formation of in-plane textured (100) MgO films on a smooth amorphous $Si_3N_4$ surface by ion beam assisted deposition (IBAD). However, it will be apparent that films of other materials having a rock salt-like structure can be deposited on other smooth amorphous surfaces.

Figure 1:
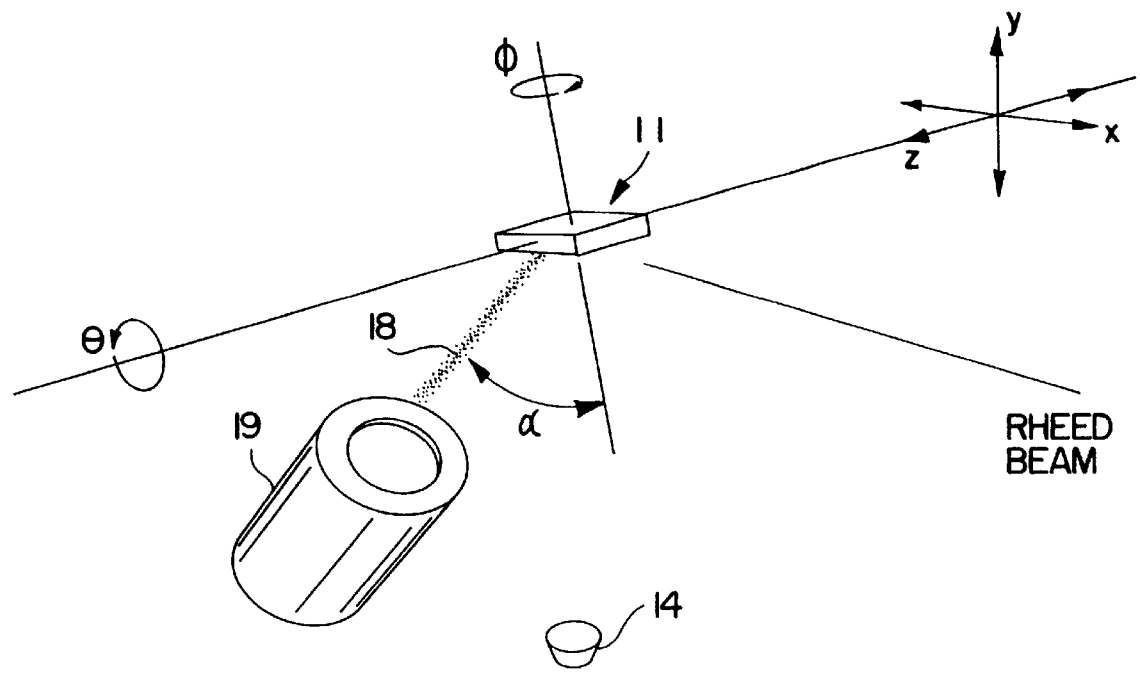
FIG. 1 schematically shows an apparatus for carrying out the present invention.
Figure 2:
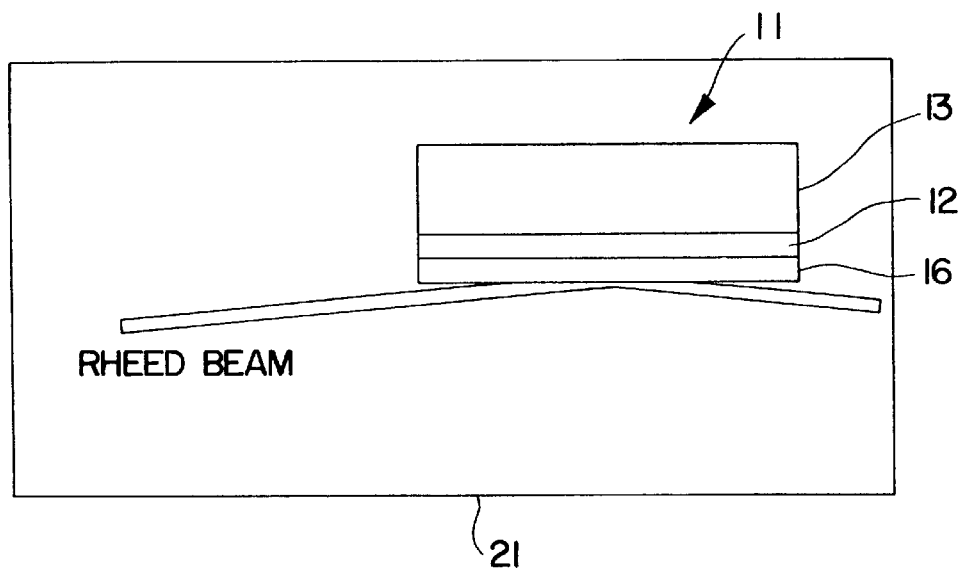
FIG. 2 shows a textured MgO film formed on an amorphous silicon nitride substrate layer.
Figure 3:
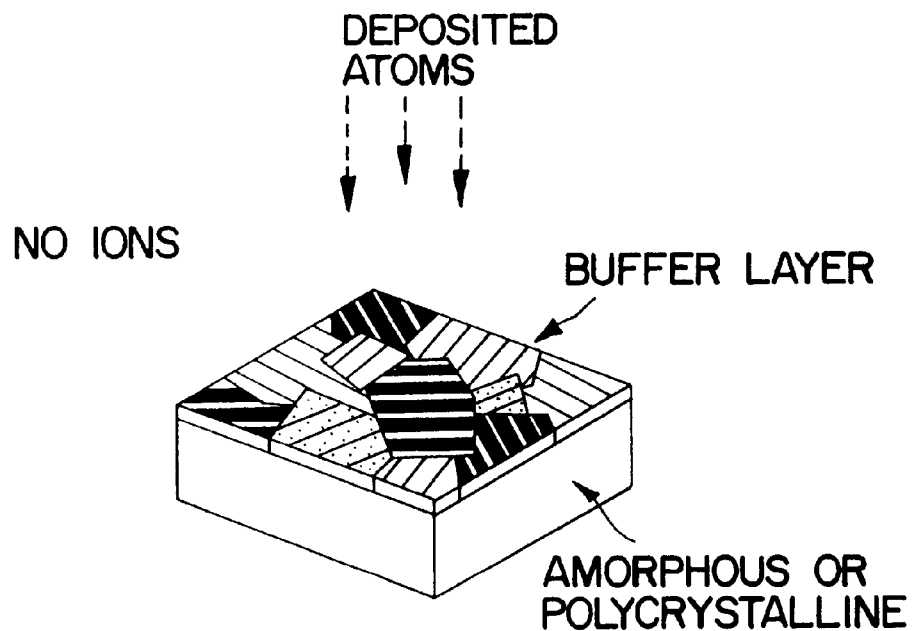
FIG. 3 is an enlarged view of a buffer layer or film deposited in accordance with the prior art.

Referring to FIGS. 1 and 2, a substrate 11 having an amorphous $Si_3N_4$ surface layer 12 formed on a single crystal silicon member 13 is positioned to receive MgO vapor from the source 14, to deposit a textured MgO film 16. The MgO is evaporated from the source by an electron beam. The deposition rate can be, for example, between 1.0 Å and 4.4 Å per second. The substrate temperature can be between room temperature or less and 400° C. Other MgO deposition methods such as sputtering or pulsed laser deposition may be used to deposit the MgO film onto the amorphous surface layer 12. Other amorphous surface layers such as $SiO_2$ can be used. FIG. 3 shows a MgO film deposited without ion beam assistance. The rock salt-like structure deposits with an out-of-plane alignment of the (001) plane. The in-plane orientation of the crystals is random as shown by the lines 17, FIG. 3.

In accordance with the present invention, an ion beam 18 is projected onto the surface of the substrate at an angle with respect to the substrate normal by an ion source 19. For example, the ion source can be a Kaufman 3 cm ion source. The ion energy can be between 200 and 1200 eV. The angle can be between 10° and 80°.

The diffraction pattern of the film is monitored in real time using a reflection high energy electron diffraction apparatus (RHEED) (not shown) which projects a RHEED beam 21 onto the deposition surface. A Faraday cup and quartz crystal monitor (not shown) are used to monitor the ion flux and evaporation rate of the material being deposited.

Figure 4:
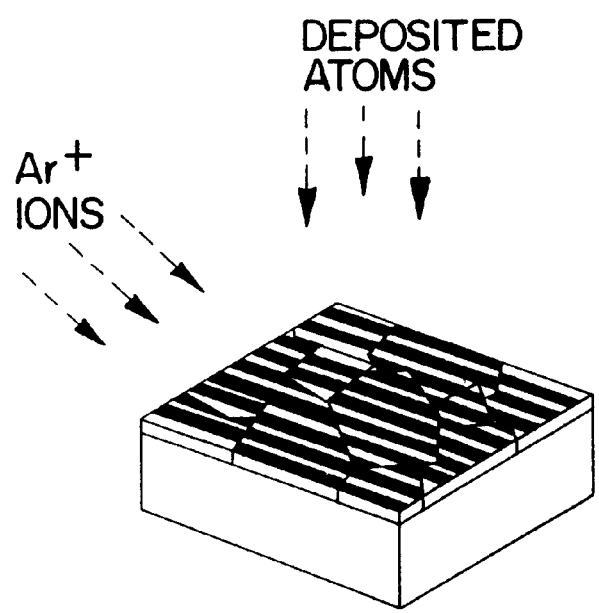
FIG. 4 is an enlarged view of a buffer layer or film deposited in accordance with the present invention.
Figure 5A:
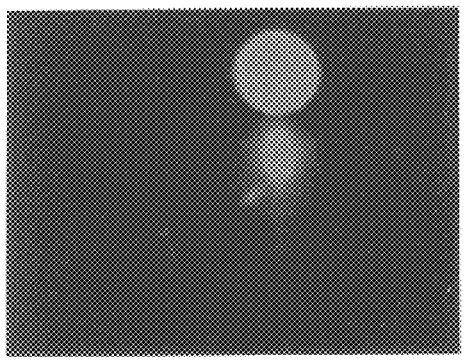
FIGS. 5(a)–5(f) show real time reflection high energy electron diffraction (RHEED) observation of an ion beam assisted deposition (IBAD) (deposited at room temperature) and homo-epi MgO film (deposited at 600° C.), in which (a) to (c) are IBAD MgO at 20, 50 and 100 Å respectively, and (d) to (f) are homo-epi MgO at 100, 400 and 800 Å respectively.
Figure 5D:
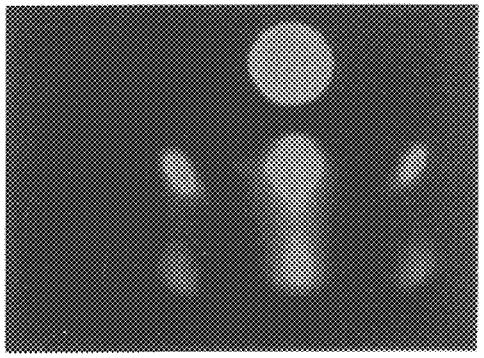
Figure 5B:
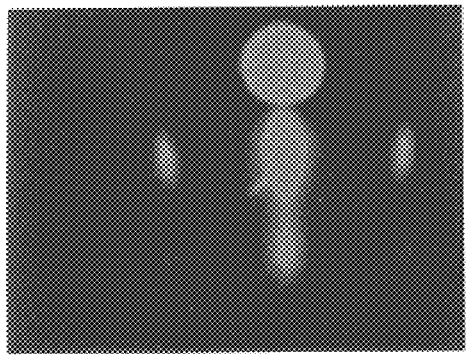
Figure 5E:
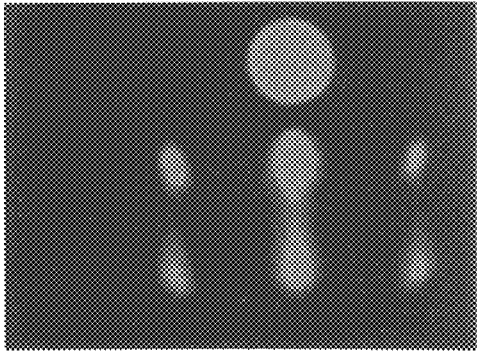
Figure 5C:
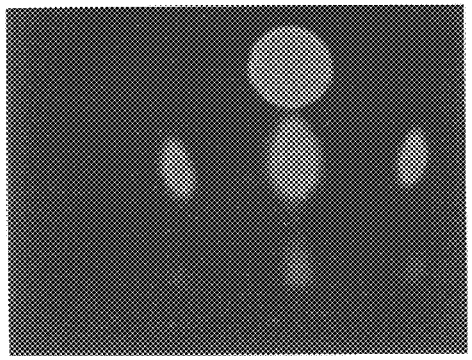
Figure 5F:
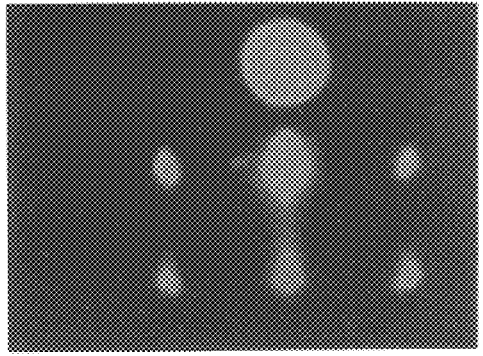

In one example MgO IBAD films 16 were deposited on an amorphous $Si_3N_4$ layer 12 carried by a silicon wafer 13, FIG. 2. The diffraction pattern of the film surface was monitored as it was deposited using RHEED. The ion source was an argon ion source $Ar^+$ at 700 eV ion energy. The flux ranged from 110–120 $\mu A/cm^2$. The angle between the ion beam and the substrate normal was 45°, which is an open or channel direction for (100) MgO. The evaporation rate of MgO was selected by monitoring the appearance of the MgO diffraction patterns in RHEED. In-plane textured MgO films were obtained from room temperature (RT) to 300° C. For an RT deposition, the best alignment was obtained with a 1.5 Å/sec evaporation rate. FIG. 4 illustrates the alignment of the crystals.

Figure 6A:
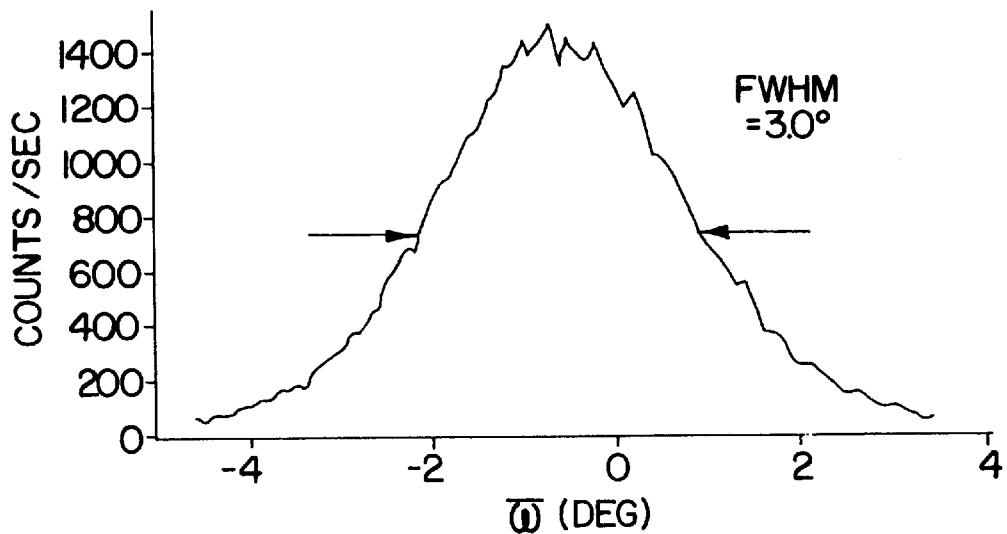
FIGS. 6(a) and 6(b) are X-ray diffraction scans of the MgO film shown in FIG. 5 (100 Å IBAD and 800 Å homo-epi film): (a) $\omega$-scan of the MgO (200) peak and (b) $\phi$-scan of the MgO (220) peak.
Figure 6B:
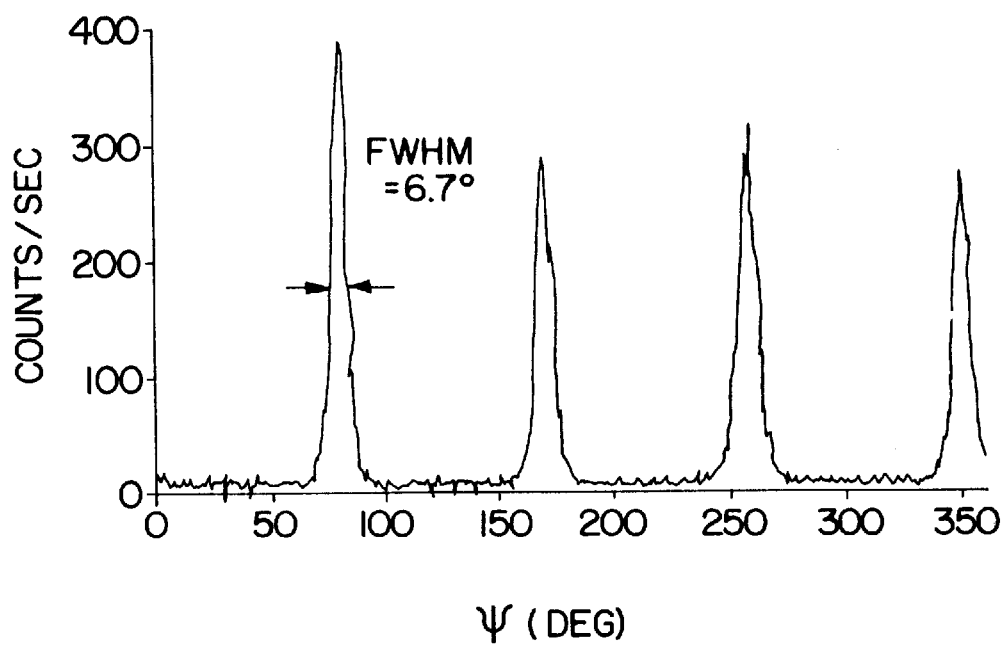

FIGS. 5(a)–(f) show a typical texturing or deposition sequence observed with the in situ RHEED. When the proper deposition conditions are set, the RHEED pattern changes from a diffused-scattering pattern (from the amorphous $Si_3N_4$ substrate) to a crystalline pattern of MgO at about 20 Å film thickness, FIG. 1(a), which is the limiting diffraction thickness of the RHEED. The pattern suggests that the MgO molecules form well-aligned small 3D crystallites right at the inception of the deposition, i.e. right at the nucleation stage, with (100) planes aligning out-of-plane and the [110] direction facing the ion source. The pattern gradually improved, FIG. 1(b), and was optimized at about 100 Å, FIG. 1(c). At the optimal texture, the ion beam was turned off, the substrate temperature was raised to 600° C. and subsequently an 800 Å homo-epi MgO was deposited so that the film was thick enough for X-ray diffraction. Based on the RHEED, no obvious additional features were introduced during the homo-epi process, FIGS. 1(d) to 1(f). X-ray diffraction of the sample, FIG. 6(a), indicates a 3° out-of-plane alignment (FWHM of the ω-scan) and FIG. 6(b) indicates a 7° in-plane alignment (FWHM of the φ-scan).

Figure 7:
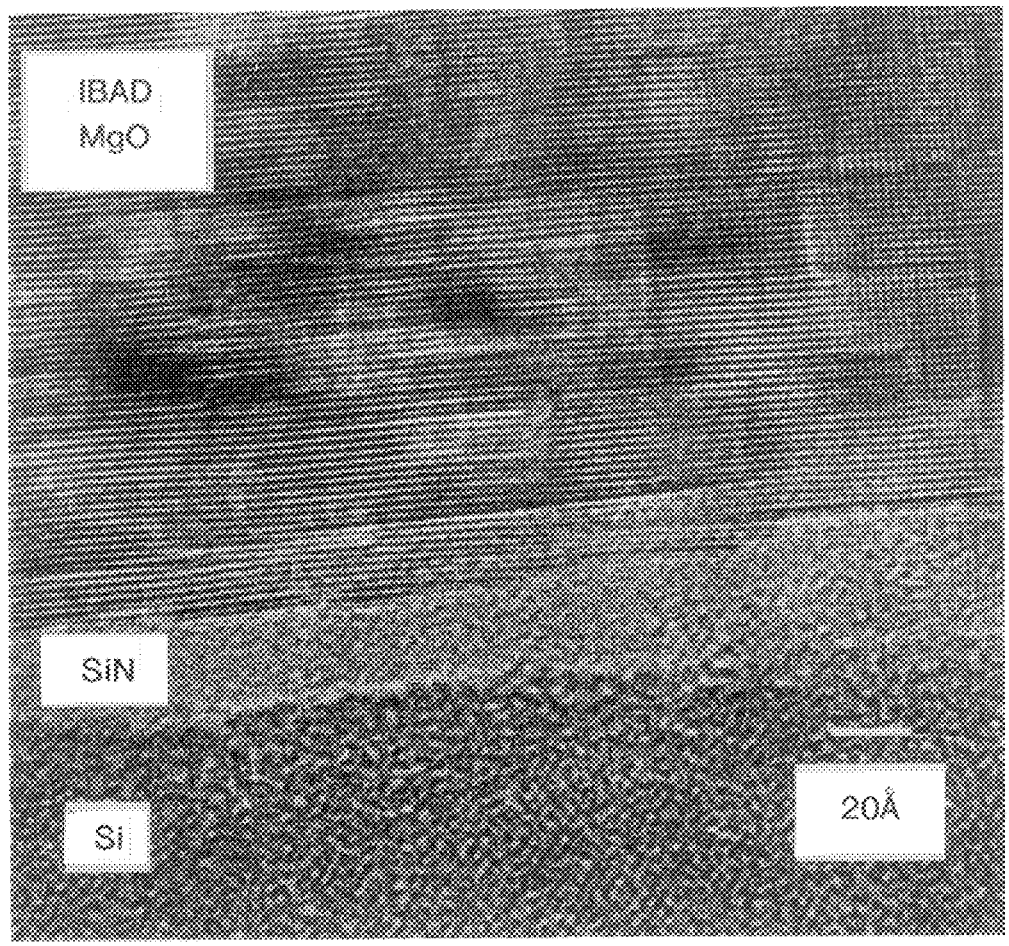
FIG. 7 is a X-TEM of an IBAD MgO (deposited at 300° C.), in which the ion beam was incident at roughly 45° with respect to the normals of the substrate and image planes.

A cross-sectional TEM (X-TEM) image, FIG. 7, reveals the texture development of the IBAD MgO, suggesting that the MgO growth is pseudo-columnar with each column consisting of small 3D crystallites, and that the alignment of these crystallites starts at the MgO/SiN interface. Combining the observations from both TEM and RHEED, a consistent picture emerges in which the MgO texture develops at the beginning of the growth, i.e. the nucleation stage. The optimal thickness of the growth likely corresponds to the point at which the surface of the substrate is fully covered by textured MgO crystallites. After that, the texture improves only slightly and eventually starts to degrade. It has also been observed that both the alignment and coverage of the textured area improved at lower substrate temperature, suggesting that the texturing process is facilitated by the denser and smaller nuclei obtained at lower temperature. This is consistent with the nucleation-texturing mechanism suggested for MgO.

the in-plane orientation, simplifying the texturing process and allowing the texture to appear at early stage. The texture of the IBAD MgO film is totally determinated at the initial stage, where the initial texture, substrate condition, and film/substrate interaction become important factors.

The preferred conditions for forming an IBAD MgO layer are: Temperature RT to 400° C.; layer thickness about 80 Å to about 150 Å; ion beam angle 45°; amorphous substrate surface; and amorphous surface roughness (RMS) less than about 100 Å.

Figure 8:
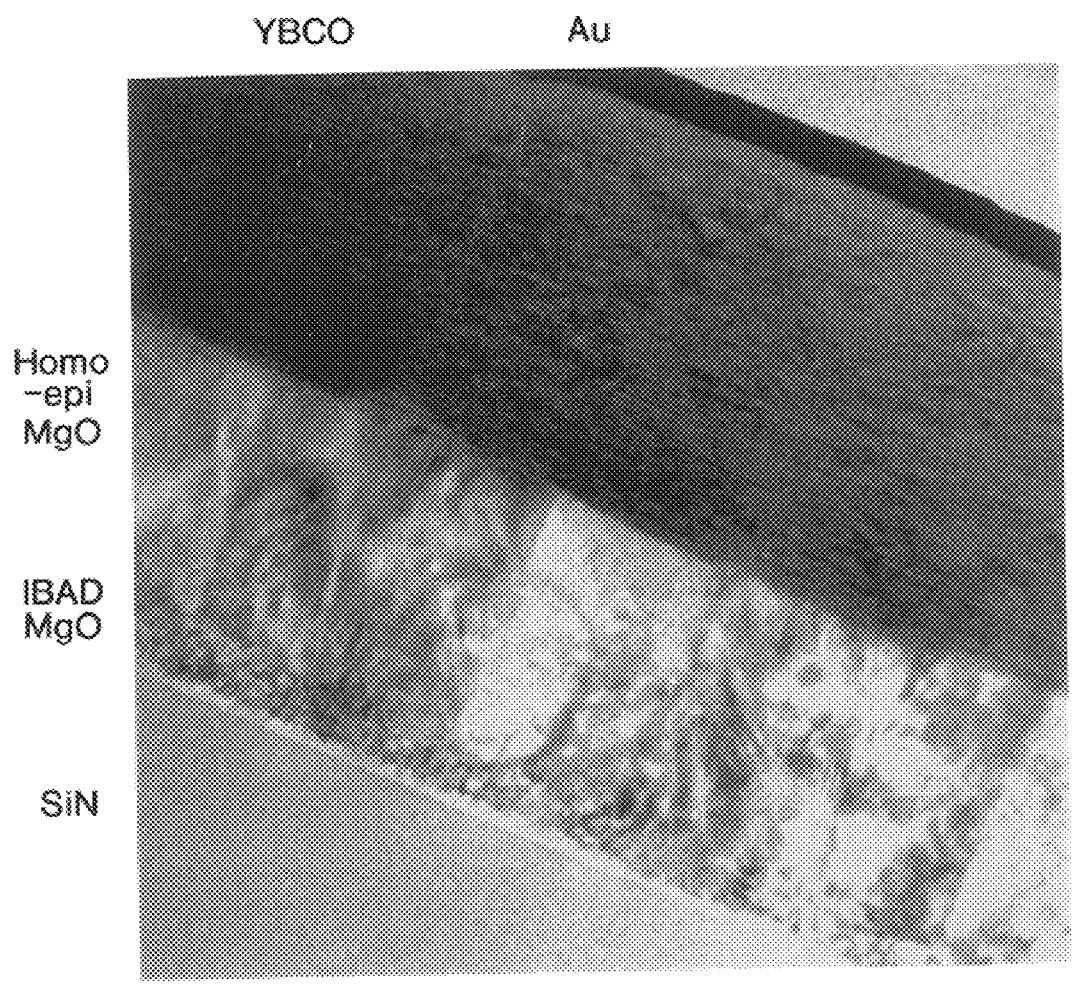
FIG. 8 is an X-TEM of a high temperature superconductor film deposited upon a buffer layer or film formed in accordance with the present invention.

The -$Si_3N_4$ substrate layer can be deposited onto a metal alloy such as Hastelloy. The MgO layer is then deposited onto the amorphous substrate as described above. The MgO/ $Si_3N_4$/Hastelloy substrate can then serve as the substrate for the deposit of YBCO to form a high temperature superconductor with a wire or ribbon. FIG. 8 is an X-TEM of a YBCO film or layer deposited on an MgO buffer layer formed on $Si_3N_4$. Table I shows five examples of YBCO/$Y_2O_3$/YSZ formed on:

Sample 1. YBCO/$Y_2O_3$/YSZ/NiO/MgO/MgO(IBAD)/$Si_3N_4$/Hastelloy tape (less polished)

Sample 2. YBCO/$Y_2O_3$/YSZ/NiO/MgO/MgO(IBAD)/$Si_3N_4$/Poly-YSZ

Sample 3. YBCO/$Y_2O_3$/YSZ/MgO/MgO(IBAD)/$Si_3N_4$/Hastelloy tape (less polished)

Sample 4. YBCO/$Y_2O_3$/YSZ/NiOfMgO/MgO(IBAD)/$Si_3N_4$/Hastelloy (well-polished)

Sample 5. YBCO/$Y_2O_3$/YSZ/NiO/MgO/MgO(IBAD)/$Si_3N_4$/Hastelloy (well-polished)

TABLE I

| Sample No. | SiN roughness (RMS)/film thickness (Å) | MgO in-plane alignment | YSZ in-plane alignment | YBCO in-plane alignment | Tc of YBCO (K) | Jc of YBCO (MA/cm$^2$) |
|---|---|---|---|---|---|---|
| 1 | — 20Å/2000Å | *** | *** | 14.3° | ~89 | 0.15 |
| 2 | −3Å/1000Å | *** | *** | 8° | ~89 | 0.05 |
| 3 | — 20Å/4000Å | ~12°–14° | ~12°–14° | ~12°–14° | *** | 0.025 |
| 4 | — 50Å/1000Å | 12.8° | 12.8° | 12.5° | 88 | 0.33 |
| 5 | — 20Å/2000Å | 12.3° | 11.4° | 8.2° | 87.8 | 0.30 |

The MgO texturing mechanism and alignment results are very different from those of IBAD (100) YSZ as described earlier. One of the major differences between the two materials is the preferred out-of-plane alignment. At high temperature, the YSZ tends to grow as (111) fiber texture (i.e. the (111) planes aligned out-of-plane while randomly oriented in-plane), and this out-of-plane alignment cannot be changed by the ion beam. Thus, the best chance to obtain (100) YSZ growth is at low temperature. At low temperature, however, the YSZ molecules lack mobility, resulting in a kinetic-limited growth. Without IBAD, either a poorly crystallized film would result or several out-of-plane alignments would co-exist. With IBAD, the ratio of the different out-of-plan orientations depends on the ion energy, deposition methods, etc. and favors (111) when sufficient molecular mobility is obtained, resulting in a complicated texturing process. Conversely, the (100) direction is the preferred out-of-plane alignment for MgO (a rock-salt structure). Thus, the ion beam only needs to align We have formed highly aligned (based on RHEED) IBAD MgO films on Metglas (Allied Signal) by the same process as described for -$Si_3N_4$ substrates. Highly aligned MgO films have also been formed on smooth amorphous surfaces of amorphous $Si_3N_4$, $SiO_2$, and polycrystalline Ni substrates.

The MgO or the like structural oxides can be deposited on suitably smooth amorphous surfaces of metals, glass fibers, wires, etc. to permit the formation of superconductor layers.

In summary, in-plane textured MgO films on amorphous SiN and other substrates have been described. The films are promising for use as a structural template for the deposition of many materials without the need of single crystalline substrates. This texturing process for MgO is a nucleation process and the alignment is a function of nuclei size and density.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An article, comprising:
   a substrate comprising a metal alloy, the substrate having at least one smooth amorphous surface, wherein the root mean square roughness of said smooth amorphous surface is less than about 100 angstroms; buffer layer comprising a first thin film formed on said amorphous surface of said substrate from a material having a rock-salt-like structure and substantial alignment both in-plane and out-of-plane; and
   a second film having substantial alignment both in-plane and out-of-plane formed on a surface of said buffer layer, wherein said first film provides a template for the epitaxial growth of said second film.

2. An article according to claim 1 wherein said second film comprises a material selected from the group consisting of superconductors, semiconductors, photovoltaic materials, magnetic materials, and precursors of superconductors.

3. An article according to claim 1 wherein the root mean square roughness of said smooth amorphous surface is less than about 100 angstroms.

4. An article according to claim 1 wherein the substrate comprises a polycrystalline non-amorphous base structure having a smooth amorphous surface layer.

5. The article according to claim 4, wherein the base structure comprises a material selected from the group consisting of alloys comprising nickel.

6. The article according to claim 5, wherein the base structure comprises a material selected from the group consisting of alloys comprising nickel as a primary component.

7. The article according to claim 6 wherein the amorphous surface layer is chemically non-identical to said non-smooth amorphous base structure.

8. The article according to claim 2, wherein said second film comprises a material selected from the group consisting of superconducting rare earth-barium-copper oxides, bismuth-strontium-calcium-copper oxides, thallium-bismuth-strontium-calcium-copper-oxides and their precursors.

9. The article of claim 1 wherein the rock-salt-like material comprises a rock-salt material.

10. The article of claim 9 wherein the rock-salt material comprises an oxide.

11. The article of claim 10 wherein the oxide comprises MgO.

12. The article of claim 1 in which the rock-salt-like material comprises a nitride.

13. The article according to claim 1, wherein said buffer layer comprises a plurality of in-plane and out-of-plane aligned films, and wherein said first film provides a template for the epitaxial growth of each of the others of said plurality of films.

14. The article according to claim 1, wherein said buffer layer comprises a third in-plane and out-of-plane aligned film, and wherein said first film provides a template for the epitaxial growth of said second and third films.

15. The article according to claim 1, wherein the thickness of the first film is less than about 200 angstroms and greater than about 20 angstroms and its alignment is better than about 13 degrees.

16. A thin film for subsequent epitaxial film deposition comprising
   a substrate comprising a metal alloy, the substrate having a smooth amorphous surface, wherein the root mean square roughness of the smooth amorphous surface of the substrate is less than about 100 angstroms; and
   a thin film of a material having a rock-salt-like structure formed on said smooth amorphous surface with substantial alignment both in-plane and out-of-plane.

17. A thin film as in claim 16 in which the material having a rock-salt-like structure has a rock salt structure.

18. A thin film as in claim 16 in which the smooth amorphous surface comprises $Si_3N_4$.

19. A structure as in claim 16 in which the substrate comprises a wire, ribbon or sheet.

20. A structure as in claim 16 in which the material having a rock salt like structure is MgO.

21. A structure as in claim 16 in which the amorphous surface structure is metal.

22. An article, comprising:
   a substrate comprising a metal alloy, the substrate having a smooth amorphous surface, wherein the root mean square roughness of the smooth amorphous surface of the substrate is less than about 100 angstroms; and
   a layer of material having a rock-salt-like structure with substantial alignment in-plane and out-of-plane, the layer of material being disposed on the smooth amorphous surface of the substrate.

23. The article of claim 22, wherein the root mean square roughness of the smooth amorphous surface of the substrate is less than about 100 angstroms.

24. The article of claim 22, wherein the substrate comprises a polycrystalline non-amorphous base structure having a smooth amorphous surface layer.

25. The article of claim 24, wherein the base structure comprises a nickel alloy.

26. The article of claim 25, wherein the base structure comprises nickel alloy as a primary component.

27. The article of claim 24, wherein the base structure comprises a metal alloy.

28. The article of claim 25, wherein the smooth amorphous surface layer of the substrate is chemically identical to the non-amorphous base structure.

29. The article of claim 22, wherein the material having a rock-salt-like structure comprises a rock salt material.

30. The article of claim 29, wherein the rock salt material comprises an oxide.

31. The article of claim 30, wherein the oxide comprises MgO.

32. The article of claim 22, wherein the material having a rock-salt-like structure comprises a nitride.

33. The article of claim 22, wherein the layer of material having a rock-salt-like structure has a thickness of from about 20 angstroms to about 200 angstroms and the alignment of the layer of material having a rock-salt-like structure is less than about 13 degrees.

34. An article, comprising:
   a substrate comprising a metal alloy, the substrate having at least one smooth amorphous surface;

a buffer layer comprising a first thin film formed on the amorphous surface of the substrate from a material having a rock-salt-like structure and substantial alignment both in-plane and out-of-plane, wherein the material having a rock-salt-like structure comprises a nitride; and a second film having substantial alignment both in-plane and out-of-plane formed on a surface of the buffer layer, wherein the first film provides a template for the epitaxial growth of the second film.

35. The article of claim 34, wherein the second film comprises a material selected from the group consisting of superconductors, semiconductors, photovoltaic materials, magnetic materials and precursors of superconductors.

36. The article of claim 34, wherein the root mean square roughness of the smooth surface is less than about 100 angstroms.

37. The article of claim 34, wherein the substrate comprises a polycrystalline non-amorphous base structure having an amorphous surface.

38. The article of claim 37, wherein the base structure comprises a material selected from the group consisting of alloys comprising nickel.

39. The article of claim 38, wherein the base structure comprises a material selected from the group consisting of alloys comprising nickel as a primary component.

40. The article of claim 39, wherein the amorphous surface layer is chemically non-identical to the non-amorphous base structure.

41. The article of claim 35, wherein the second film comprises a material selected from the group consisting of superconducting rare earth-barium-copper oxides, bismuth-strontium-calcium-copper oxides, thallium-bismuth-strontium-calcium-copper oxides and their precursors.

42. The article of claim 34, wherein the rock-salt-like material comprises a rock-salt material.

43. The article of claim 34, wherein the buffer layer comprises a plurality of in-plane and out-of-plane aligned films, and wherein the first film provides a template for the epitaxial growth of each of the others of the plurality of films.

44. The article of claim 34, wherein the buffer layer comprises a third in-plane and out-of-plane aligned film, and wherein the first film provides a template for the epitaxial growth of the second and third films.

45. The article of claim 34, wherein the thickness of the first film is less than about 200 angstroms and greater than about 20 angstroms and its alignment is better than about 13 degrees.

46. A thin film for subsequent epitaxial thin film deposition comprising a substrate comprising a metal alloy; and a thin film of a material having a rock-salt-like structure formed on the smooth amorphous surface with substantial alignment both in-plane and out-of-plane, wherein the material having a rock-salt-like structure comprises a nitride.

47. The thin film of 46, wherein the material having a rock-salt-like structure has a rock salt structure.

48. The thin film of claim 46, wherein the nitride comprises TiN.

49. The thin film of claim 46, wherein the substrate comprises a wire, ribbon or sheet.

50. The thin film of claim 46, wherein the amorphous surface comprises a nickel alloy.

51. The thin film of claim 46, wherein the amorphous surface structure comprises a metal.

52. The thin film of claim 46, wherein the root mean square roughness of the smooth amorphous surface is less than about 100 angstroms.

53. An article, comprising:

a substrate comprising a metal alloy, the substrate having a smooth amorphous surface; and a layer of material having a rock-salt-like structure with substantial alignment in-plane and out-of-plane, the layer of material being disposed on the smooth amorphous surface of the substrate wherein the material having a rock-salt-like structure comprises a nitride.

54. The article of claim 53, wherein the root mean square roughness of the smooth amorphous surface of the substrate is less than about 100 angstroms.

55. The article of claim 53, wherein the substrate comprises a polycrystalline non-amorphous base structure having a smooth amorphous surface layer.

56. The article of claim 55, wherein the base structure comprises a nickel alloy.

57. The article of claim 56, wherein the base structure comprises nickel alloy as a primary component.

58. The article of claim 53, wherein the base structure comprises a metal alloy.

59. The article of claim 54, wherein the smooth amorphous surface layer of the substrate is chemically identical to the non-amorphous base structure.

60. The article of claim 53, wherein the material having a rock-salt-like structure comprises a rock salt material.

61. The article of claim 53, wherein the layer of material having a rock-salt-like structure has a thickness of from about 20 angstroms to about 200 angstroms and the alignment of the layer of material having a rock-salt-like structure is less than about 13 degrees.

* * * * *

UNITED STATES PATENT AND TRADEMARK OFFICE
CERTIFICATE OF CORRECTION

PATENT NO.     : 6,190,752 B1
DATED          : February 20, 2001
INVENTOR(S)    : Do et al.

It is certified that error appears in the above-identified patent and that said Letters Patent is hereby corrected as shown below:

<u>Title page,</u>
Item [56], References Cited,
Under US PATENT DOCUMENTS, 5,453,306, delete "4278/569" and insert
-- 427/569 --
Under OTHER PUBLICATIONS, "Mao, Ying jun, et al.," reference, delete "superconductions" and insert -- superconducting --

<u>Column 8,</u>
Line 9, insert -- thin -- after "epitaxial"

<u>Column 10,</u>
Line 40, delete "54" and insert -- 55 --

Signed and Sealed this

Thirtieth Day of July, 2002

Attest:

Attesting Officer

JAMES E. ROGAN
*Director of the United States Patent and Trademark Office*